(12) United States Patent
White

(10) Patent No.: US 6,379,868 B1
(45) Date of Patent: Apr. 30, 2002

(54) LITHOGRAPHIC PROCESS FOR DEVICE FABRICATION USING DARK-FIELD ILLUMINATION

(75) Inventor: Donald Lawrence White, Morris Plains, NJ (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/283,528

(22) Filed: Apr. 1, 1999

(51) Int. Cl.[7] ............................. G03F 7/00; G03F 7/20
(52) U.S. Cl. ......................... 430/311; 430/5; 430/396; 430/494
(58) Field of Search ......................... 430/5, 311, 396, 430/494

(56) References Cited

U.S. PATENT DOCUMENTS

| | | | | |
|---|---|---|---|---|
| 3,800,298 A | * | 3/1974 | Ogura et al. ................ | 340/173 |
| 4,947,413 A | * | 8/1990 | Jewell et al. ................ | 378/34 |
| 5,138,176 A | | 8/1992 | Nishi ........................ | 250/548 |
| 5,343,292 A | * | 8/1994 | Brueck et al. ............... | 356/363 |
| 5,446,587 A | * | 8/1995 | Kang ........................ | 359/562 |
| 5,667,918 A | | 9/1997 | Brainerd et al. ............. | 430/5 |
| 5,677,756 A | * | 10/1997 | Nozue ....................... | 355/53 |
| 5,717,518 A | | 2/1998 | Shafer et al. ............... | 359/357 |
| 5,807,649 A | | 9/1998 | Liebmann et al. ............. | 430/5 |
| 5,821,014 A | | 10/1998 | Chen et al. ................. | 430/5 |

FOREIGN PATENT DOCUMENTS

JP        6-161092      * 11/1992

OTHER PUBLICATIONS

Kamon et al., J. Vac. Sci. Technol. B, "Experimental and Simulated Estimation of New Super Resolution Technique", vol. 14(6), pp. 4171–4174, Nov./Dec. 1996.

Kamon et al., Jpn. J. Appl. Phys., "Proposal of a Next–Generation Super Resolution Technique", vol. 33, No. 12B, pp. 6848–6854, Dec. 1994.

Matsumoto et al., SPIE, "Innovative Image Formation: Coherency Controlled Imaging", vol. 2197, pp. 844–853, May 1994.

* cited by examiner

*Primary Examiner*—Mark F. Huff
*Assistant Examiner*—Nicole Barreca
(74) *Attorney, Agent, or Firm*—Richard J. Botos

(57) ABSTRACT

A lithographic apparatus and process that utilizes dark-field imaging of mask features to introduce an image of those features into an energy sensitive resist material is disclosed. Dark field imaging is accomplished by utilizing off-axis illumination in combination with one or more masks. The zero-order off-axis illumination is lost from the system and is not captured from the downstream imaging optics. The mask or mask contains both lithographic features and non-imaged features. The non-imaged features are too small to be resolved by the imaging optics used to introduce the image into the energy sensitive material. The lithographic features and non-imaged features associated with a particular pattern feature are either present on the same mask, or decoupled where the non-imaged features are on one mask and the lithographic features are on a second mask.

15 Claims, 7 Drawing Sheets

LITHOGRAPHIC PROCESS FOR DEVICE FABRICATION USING DARK-FIELD ILLUMINATION

BACKGROUND OF THE INVENTION

1. Technical Field

The present invention is directed to lithographic processes for device fabrication and, in particular, to resolution enhancement techniques for such processes.

2. Art Background

In lithographic processes for device fabrication, radiation is typically projected onto a patterned mask (also referred to as a reticle) and the radiation transmitted through the mask is further transmitted onto an energy sensitive material formed on a substrate. Transmitting the radiation through a patterned mask patterns the radiation itself and an image of the pattern is introduced into the energy sensitive material when the energy sensitive resist material is exposed to the patterned radiation. The image is then developed in the energy sensitive resist material and transferred into the underlying substrate. An integrated circuit device is fabricated using a series of such exposures to pattern different layers of material formed on a semiconductor substrate.

An integrated circuit device consists of a very large number of individual devices and interconnections therefore. Configuration and dimensions vary among the individual devices. The pattern density, (i.e. the number of pattern features per unit area of the pattern) also varies. The patterns that define integrated circuit devices are therefore extremely complex and non-uniform.

As the complexity and density of the patterns increase, so does the need to increase the accuracy of the lithographic tools that are used to create the patterns. The accuracy of lithographic tools is described in terms of pattern resolution. The better the resolution, the closer the correspondence between the mask pattern and the pattern that is created by the tool. A number of techniques have been used to enhance the pattern resolution provided by lithographic tools. The most prevalent technique is the use of shorter wavelength radiation. However, this technique is no longer viable when exposure wavelengths are in the deep ultraviolet (e.g., 248 nm, 193 nm and 157 nm) range. Using wavelengths below 193 nm to improve resolution is not feasible because the materials used for lenses in optical lithography cameras absorb this shorter wavelength radiation.

Resolution enhancement techniques (RET) other than simply using shorter wavelength radiation have been proposed. These techniques use exotic illumination from the condenser (e.g. quadrupole illumination), pupil filters, phase masks, optical proximity correction, and combinations of these techniques to obtain greater resolution from an existing camera. However, such techniques typically improve resolution only for some of the individual features of a pattern. The features for which resolution is improved are identified as the critical features. The resolution of many other features is either not improved or actually degraded by such resolution enhancement techniques. Thus, current RETs require a compromise between resolution enhancement for the critical features and resolution degradation for the non-critical features. Such compromises usually require sub-optimal illumination of the critical features in order to avoid significant degradation in the illumination of the non-critical features.

Resolution enhancement techniques have been proposed to customize mask feature illumination in projection lithography for the various different features in the mask. One such technique is described in Matsumoto, K., et al., "Innovative Image Formation: Coherency Controlled Imaging," *SPIE*, Vol. 2197, p. 844 (1994). That technique employs an additional mask and additional lens to customize the radiation incident on each feature of the mask. The arrangement proposed in Matsumoto et al. is illustrated schematically in FIG. 1. In the arrangement 10, light from an off-axis source 15 illuminates a first mask 20. Matsumoto describes the use of a quadrupole source 15 for off-axis illumination. In a quadrupole source 15 light passes from the source 11 and through a condenser lens 13 and an element 14 with four apertures 16 of identical size and configuration (FIG. 2) therein. The apertures 16 are spaced equidistantly from a common point (which is the optical axis of the optical projection camera). Furthermore, the centers of two apertures 16 and the common point are on a first line 17 and the centers of the other two sources and the common point are on a second line 18 perpendicular to the first line.

An image from the first mask 20 is projected through a first lens 22 onto a second mask 25. The first lens 22 is equipped with a pupil filter 23. The image from the second mask 25 is projected through a second lens 30 and onto a substrate 35 with a layer of energy sensitive material 40 formed thereon. A similar system is described in Kamon, K., "Proposal of a Next-Generation Super Resolution Technique," *Jpn. J. Appl. Phys.*, Vol. 33, Part 1, No. 12B, p. 6848 (1994).

In the resolution enhancement techniques described in Matsumoto et al. and Kamon et al., the first mask has features that are identical to the features on the second mask. The features on the first mask diffract the radiation incident on the mask, and the diffracted radiation illuminates the identical feature on a second mask. For example, radiation transmitted through a grating pattern on the first mask is projected onto an identical grating pattern on the second mask. Similarly, radiation transmitted through an isolated line on the first mask is projected onto an identical isolated line on the second mask. When the diffracted energy from the first mask illuminates the identical feature on the second mask, the resulting image is often superior to an image obtained from quadrupole illumination of the pattern. Therefore, this resolution enhancement technique provides an improvement in aerial image quality (i.e. the image in the focal plane of the projection lens) over conventional off-axis illumination using the quadrupole system.

The above-described resolution enhancement technique provides customized illumination for more features than quadrupole illumination. However, the above-described technique does not improve the resolution of all features in the pattern. Furthermore, the two-mask system is costly and complex. Specifically, the system requires two precisely patterned masks instead of one. The corresponding features on the first and second masks must match precisely. The alignment of the first and second masks is also critical. Furthermore, the technique is limited because the features on the first mask are illuminated uniformly. Thus, the problems associated with non-customized illumination of a patterned mask are not eliminated by this system, but simply stepped further back into the optics of the system. Therefore, resolution enhancement techniques that improve the resolution of all features and are cheaper and easier to implement are sought.

SUMMARY OF THE INVENTION

The present invention is directed to a lithographic process for device fabrication that utilizes dark-field illumination for resolution enhancement of an image. As used herein, dark-field radiation is radiation from which the zero-order power is removed. The dark-field image is obtained using a mask in which the transmissive regions contain very fine patterns that are of a size selected so that the patterns will not be imaged (the non-imaged mask features hereinafter). In one embodiment of the present invention, the non-imaged mask features are combined with the pattern features in a single mask. In a second embodiment, the non-imaged mask features are formed on a first mask and the pattern features are formed on a second, separate mask.

In the process of the present invention, light from an off-axis source is incident on the mask that contains the non-imaged mask features. The off-axis angle (i.e. the angle between the off-axis illumination and the optical axis) is selected so that the zero order light transmitted through the mask is lost from the system. In the context of the present invention, light that is lost from the system is light that is not captured by the downstream system optics. This illumination is dark-field since a perfectly clear area on a mask illuminated in this manner would be black. Only radiation diffracted from the mask that contains the non-imaged features is captured by the downstream system optics.

The process of the present invention provides the flexibility of tailoring the non-imaged mask features to improve the illumination of all the mask pattern features, not just certain types of features. In the embodiment of the present invention wherein the mask pattern features and the non-imaged features are in a single mask, the non-imaged features are typically gratings that provide additional definition to the image. These are referred to as fine features and are typically placed within the confines of the pattern features on the mask. The mask pattern features are formed to modulate the radiation diffracted from the fine features. This modulation produces a secondary diffraction of rays that make a small angle around the beam diffracted from the fine pattern. The mask pattern features are coarser than the fine features. Consequently, light diffracted from the mask pattern features carries the pattern information and light diffracted from the fine features is the carrier that directs the light in the desired direction (i.e. into the optics downstream from the mask). The interaction between the side-band pattern information and the fine feature carrier introduces an interference pattern in the energy-sensitive resist material.

In the embodiment of the present invention wherein two masks are used, the first mask has opaque regions and clear regions that contain the non-imaged features. The incident light diffracted from the non-imaged features is projected through a lens and onto the second mask, which contains the mask pattern features. The zero order radiation from the condenser is not projected through the lens because the angle of incidence of the off-axis illumination is selected to ensure that the zero order light is not transmitted through the lens and onto the second mask. The use of a mask with sub-resolution size features allows for customization of the illumination of each feature of the second mask. For example, one sub-resolution feature is provided that transmits, at optimal angles, illumination to one feature (e.g. grating) on the second mask. A second sub-resolution feature is provided that transmits a cone of angles about the optic axis (often called top hat) to another feature. The sub-resolution features are tailored to provide customized illumination to pattern features on the second mask.

DETAILED DESCRIPTION

The present invention is a lithographic process for device fabrication in which radiation from a source is transmitted through at least one patterned mask. Transparent and opaque regions define the pattern in the mask. The radiation transfers an image of the pattern in the mask into a layer of energy sensitive material formed on a substrate. The image is transferred into the energy sensitive material via imaging optics interposed between the mask and the energy sensitive material. The present invention utilizes dark-field resolution enhancement to create the image. Dark-field resolution enhancement is obtained by introducing radiation from a source onto a patterned mask. The radiation transmitted through the mask is either zero order (not diffracted) or nth order where n is a positive or negative integer. The zero order radiation transmitted through the mask is not captured by the imaging optics downstream of the mask. Consequently, the zero order radiation transmitted through the mask is not used to transmit the image into the layer of energy sensitive material.

Figure 1:
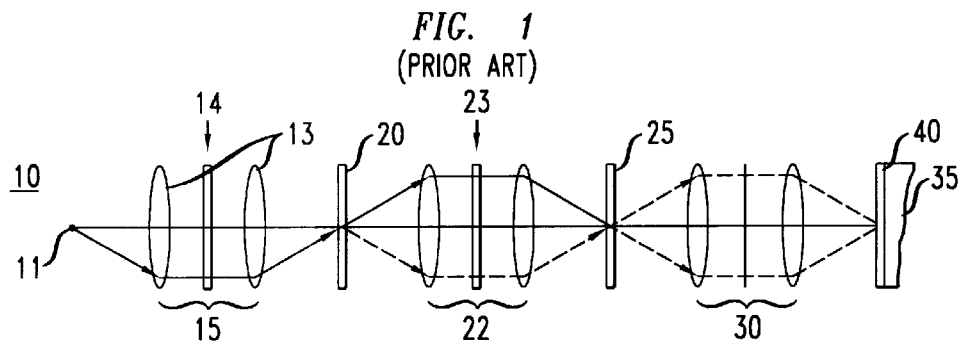
FIG. 1 is a schematic of the prior art two-mask resolution enhancement technique.
Figure 2:
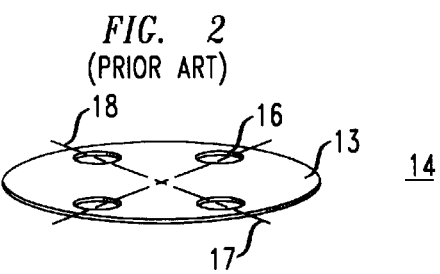
FIG. 2 illustrates a quadrupole source aperture.
Figure 3:
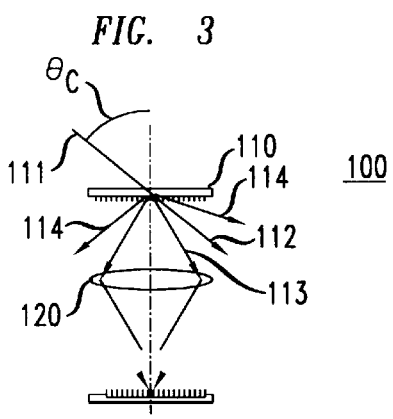
FIG. 3 is a schematic of the embodiment of the present invention which utilizes one mask containing both pattern features and non-imaged mask features.

One embodiment of the present invention is illustrated schematically in FIG. 3. The imaging apparatus 100 has a mask, 110. Radiation 111 is incident on the mask 110 at an angle, $\theta_c$, that is selected so that light 112 that is transmitted through the mask 110 is not captured by the optics 120 downstream from the mask 110. However, light 113 that is diffracted by the mask is captured by the downstream imaging optics 120. The imaging optics focus that image and transfer it into the layer of energy sensitive material. Some diffraction orders (114) are purposely not captured.

In the embodiment illustrated in FIG. 3, the mask 110 contains both pattern information and fine features that are too small to be resolved by the imaging optics. In the context of the present invention, a feature that is too small to be resolved (i.e. a sub-resolution feature), is a feature that is too small to introduce a developable image into the energy sensitive material. However, the sub-resolution (i.e. non-imaged) features of the present invention are designed to diffract light into the imaging optics (i.e. the camera) downstream from the sub-resolution features. The light diffracted from the sub-resolution features and into the camera is then used to introduce the image of the resolvable features into the energy-sensitive material.

These non-imaged features are referred to herein as dark field features because they diffract or scatter light from the off-axis condenser beam into the camera lens. The features that provide a developable image in the energy sensitive resist material are referred to as lithographic features herein.

One skilled in the art will appreciate that a feature that is too small to be resolved is a feature that provides a blurred image that has an intensity that is less than is required for a resolvable feature. For example, a feature that is too small to be resolved is a feature that provides a blurred, approximately circular image. The approximately circular image has a diameter in the range of about 0.25 $\lambda$/NA to about 0.5 $\lambda$/NA, where $\lambda$ is the wavelength of the exposing radiation and NA is the numerical aperture of the downstream lens. One skilled in the art will appreciate that the size of the blurred image is determined by the type of illumination.

The pattern information is the lithographic features. Light is diffracted by both the dark field features and the lithographic features. In the embodiment of the present invention where the dark field features are on a first mask and the lithographic features are on a second mask, the various beams transmitted through the second mask are characterized by two numbers. The first number is the order of the beam diffracted by the dark field feature. Since zero order light is lost by the system, the first number is either +1 or −1, and is most typically −1. The second number is the order of the beam transmitted through the lithographic feature when illuminated by the dark field beam. The second number is −1, 0 or +1. Thus a beam of radiation that is referred to as (−1, +1) means that the −1 first dark-field order is further diffracted by the lithographic feature and only the +1 order remains as a result of this further diffraction. The beams of radiation that are further diffracted by the lithographic feature are referred to as satellite beams. A beam of radiation that is referred to as (−1, 0) is not further diffracted by the lithographic feature.

The dark field features are used to enhance the resolution of the lithographic features. The dark field features enhance the resolution of the lithographic features by directing energy into the lens at certain angles. One example of a dark field feature is a grating with a period that is approximately equal to $\lambda/\sin(\theta)$ where $\lambda$ is the wavelength of the exposing radiation and $\theta$ is the angle of the radiation from the condenser lens relative to the optical axis of the exposure apparatus.

The dark field features have an orientation on the mask that will diffract the radiation incident on the mask in the desired direction. For example, if the incident radiation is quadrupole along the x and y-axis, the dark field gratings are about parallel to one of either the x or y-axis (and about perpendicular to the other of the two axes). If the quadrupole beams are incident at a 45 degree angle to the x and y-axis, the dark field gratings are at a 45 degree angle to one of either the x or y axis. Consequently, most of the energy diffracted into the downstream imaging optics comes from just two of the four quadrupole beams. The grating diffracts energy into the lens pupil of the imaging optics downstream from the mask. The period of the grating and the orientation of the grating control the angle of diffraction.

The dark field features have an orientation on the mask relative to the lithographic features as well. For example, if the dark field feature is a grating and the lithographic feature is a line, the orientation of the dark field grating lines is either parallel or perpendicular to the lithographic feature line.

Figure 4:
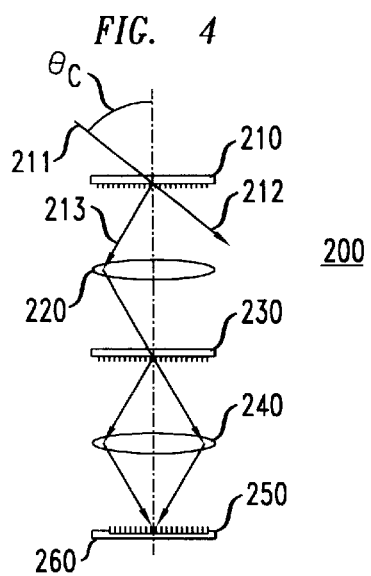
FIG. 4 is a schematic of the embodiment of the present invention, which utilizes two masks, the first mask containing non-imaged mask features and the second mask containing pattern features.

A second embodiment of the present invention is illustrated in FIG. 4. The imaging apparatus 200 has a first mask, 210. Radiation 211 is incident on the mask 210 at an angle, $\theta_c$, that is selected so that light 212 that is transmitted (i.e., zero-order light) through the mask 210 is not captured by the optics 220 downstream from the mask 210. However, light 213 that is diffracted by the mask 210 (i.e., nth order light where n is either a positive or negative integer greater than zero) is captured by the downstream imaging optics 220. The imaging optics 220 focus the light diffracted from mask 210 onto a second mask 230. The image from mask 230 is transmitted through optics 240 and the image is transferred into the layer of energy sensitive material 250 formed on substrate 260.

Since the process of the present invention uses diffracted radiation to introduce the image into the energy sensitive material, it is advantageous if the dark field features are gratings (the non-imaged gratings are referred to as dark field gratings). Gratings allow a high degree of control over the diffraction patterns they produce. A grating is a periodic structure that is conventionally described as a series of lines and spaces (the dark field grating in the present invention is an alternating series of opaque and non-opaque regions).

The grating period (the centerline to centerline distance between two adjacent lines or spaces in the grating structure) controls the angle of the diffracted light. Therefore, the grating period is selected to control the angle at which the light diffracted from the grating is incident on the components (i.e., the optical elements, masks, or the layer of energy sensitive material) downstream from the grating. Typically, the lines in a grating are perpendicular to the direction of the incident radiation in the mask plane. If the grating lines are tilted, the angle of the diffracted radiation is changed. Consequently, by fine control of the dark field grating period and the tilt of the grating lines relative to the condenser radiation, the grating is used to diffract the radiation in two orthogonal directions (e.g., the x and y-axis).

The grating's duty cycle is the ratio of the grating line width to the grating period. A grating diffracts at maximum efficiency when the grating duty cycle is 0.5 (fifty percent). Thus, the duty cycle of the grating controls the intensity of the diffracted radiation.

In the present invention, gratings are used to control the brightness of individual features to improve the overall image. For example, the image of a lithographic feature line is brighter than the image of a lithographic feature hole. In the present invention, a dark field grating with a duty cycle of less than fifty percent is provided to reduce the brightness of the feature line relative to that of the feature hole without reducing the dimensions of the line itself.

The phase of the grating is used to control the phase of the radiation diffracted by the grating. Specifically, when there are two or more gratings on a mask, the gratings are in phase if the distance between the center of the last line of one grating and the first line of the next grating is a positive, whole-number integer multiple of the grating periods. The gratings are 180 degrees out of phase if the distance between the last line of one grating and the first line of the next grating is an integer half multiple (e.g. 1.5, 2.5, etc.) of the grating periods. When the dark-field gratings are 180 degrees out of phase, they behave much like a 0-π phase mask in ordinary lithography. Thus, it is the position of the gratings, and not the materials from which the gratings are made, that cause the phase-shifting behavior of the mask.

Consequently, the dark field gratings provide great flexibility for controlling the direction and intensity of the radiation diffracted from the gratings. Specifically, the x and y direction of the diffracted radiation is controlled by the grating period and the tilt of the grating lines. The intensity of the diffracted radiation is controlled by the duty cycle of the grating. The phase of the diffracted radiation is controlled by the phase of the gratings on the mask. Thus, the dark field gratings are used not only to diffract the light incident thereon, but also are designed to tailor the diffracted light to meet the specific lithographic needs.

The present invention also contemplates that the dark field gratings will be made using phase shifting materials. The phase-shifting materials improve the efficiency of the grating, but do not otherwise effect grating performance. For example, if 0-degree or 180-degree phase shifting materials are used to make the dark gratings, the grating efficiency is increased. However, the gratings otherwise behave the same as gratings made of clear and opaque materials. Specifically, the maximum efficiency of clear/opaque gratings is about ten percent. The efficiency of a 0–180 degree phase shift grating is about forty percent. The problems associated with phase-shift masks (the requirement that the zero order radiation be canceled out) are avoided in the present invention, because the zero order light is lost from the system. Consequently, the design and fabrication of phase shifting masks for the present invention is much simpler, because the constraints on design and fabrication imposed by the need to cancel the zero order light are not present.

The phase of the light diffracted into the lens depends upon the position of the dark field grating lines. Furthermore, there are virtually no constraints on the period and orientation of the lines during the mask writing process. Consequently, the period and orientation of the lines can be selected to provide a phase within a wide range of phases, not simply 0 or pi. This ability to adjust the phase of the features permits the graceful termination of features imaged using a mask with non-imaged features. Graceful feature termination is a problem when conventional phase masks are used.

Examples of dark field features are discussed below in terms of their use in either the one-mask embodiment or the two-mask embodiment of the present invention. The lithographic features are physically combined with the dark field features on a single mask in the one-mask embodiment. In the two-mask embodiment, the dark field features are on a first mask and the lithographic features are on a second mask. Thus, in the one-mask embodiment, the lithographic features in the image projected onto the target are clearly identified in the single mask. In the two-mask embodiment, the lithographic features are clearly identified in the second mask. The first mask in the two-mask embodiments has dark field features that correspond to their associated lithographic feature only in their general area and placement on the mask, but not necessarily in the details of their associated lithographic feature.

The following are examples of gratings that are designed to provide dark field illumination for particular types of features. One skilled in the art will appreciate that there are many different gratings that will accomplish the same objective. Therefore, the following examples are not to be construed as the only grating design suitable for dark-field imaging of a specific type of feature. Also, in the following examples, the dark field features are depicted as dark (opaque) on a bright (transparent) background and the lithographic features are depicted as bright (transparent) on a dark (opaque) background. The image is depicted as bright on a dark image plane. In the FIGS., dark or opaque is indicated by cross-hatching.

Figure 5:
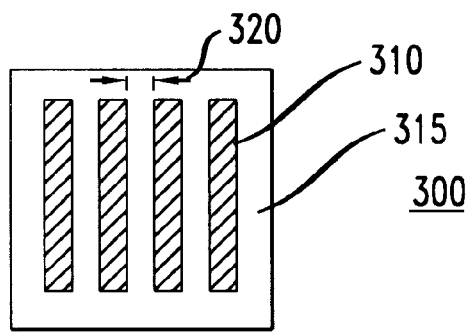
FIG. 5 illustrates a mask that creates a dark-field image of a contact pad.

In this first example, the printed feature is a square contact pad that is 0.4 μm wide. If the camera has a 4x-reduction factor, the feature on the mask is 1.6 μm wide. The exposing radiation has a wavelength of 193 nm. A mask suitable for dark-field imaging of such a feature (using the single mask system 100 illustrated in FIG. 3) is illustrated in FIG. 5. The mask 300 has four grating lines 310, formed on a transparent substrate 315. The lines are either a reflective metal or a phase shifting material. The grating period 320 is 0.55 μm. One skilled in the art is aware that the angle of the diffracted radiation is determined by the angle, $\theta_c$ (formed between the incident radiation and the optical axis of the imaging system) and the period of the grating. One skilled in the art is also aware that it is easier to control the period of a grating than to precisely control the linewidth of each individual line in the grating. Based upon the grating period, if the off-axis illumination incident on the mask has a $\theta_c$ of 20 degrees, then the radiation diffracted by the grating will be within about one degree of the optical axis of the imaging optics (e.g. lens 120 in FIG. 3) downstream from the mask 300.

Changing the period of the grating will change the angle at which the radiation is incident on the energy-sensitive resist material. Radiation is incident on the energy-sensitive resist material at a non-zero angle in off-axis illumination (e.g. quadrupole illumination, annular illumination). Thus the grating period is selected to provide the desired angle of illumination as well as to provide the desired dark field imaging.

Figure 6:
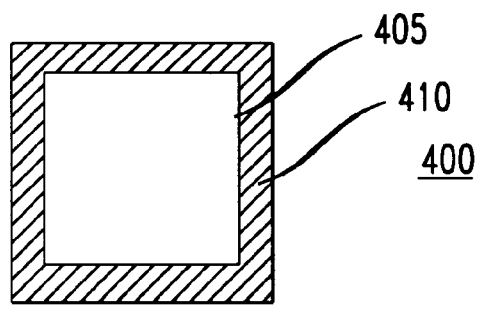
FIG. 6 is the image created using the mask illustrated in FIG. 5.

The individual lines 310 of the grating illustrated in FIG. 5 have a width of about 0.25 μm. The radiation diffracted from such a grating has an angular spread that is less than about ±three degrees. Diffracted radiation with such a spread corresponds to top-hat illumination with a filling factor (σ) of about 0.3. The image 400 that is obtained from the mask grating illustrated in FIG. 5 is illustrated in FIG. 6. Light that is not diffracted by the grating is zero-order light and is lost from the imaging system. Consequently, the image 400 in FIG. 6 is that of a pad 405 surrounded by a dark background 410 that represents the image plane.

Figure 7:
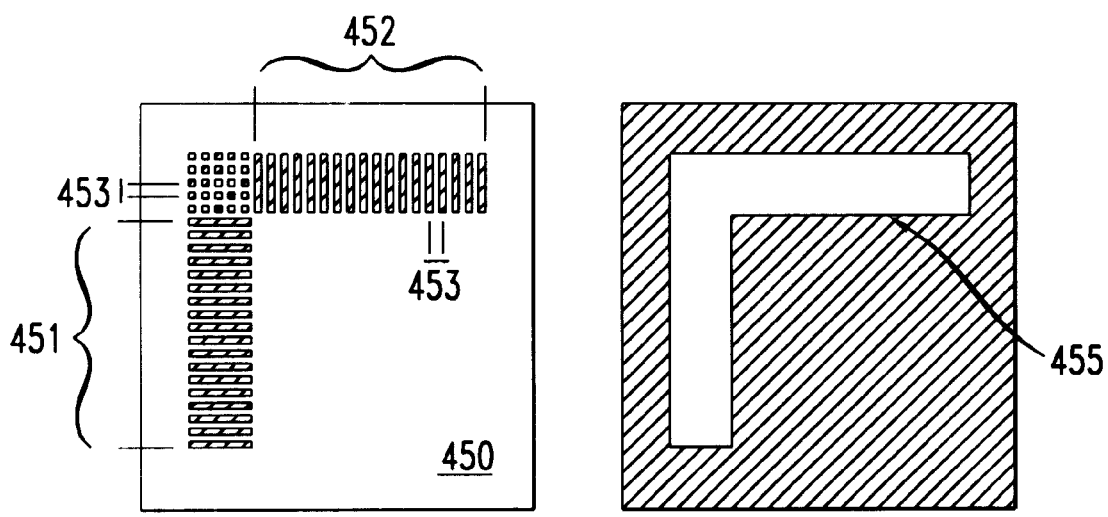
FIG. 7 illustrates a dark field mask and the image created using the mask wherein the dark field features include a periodic array of features.

The dark-field features used in the present invention are not limited to gratings. For example, a two-dimensional array of squares or spots is contemplated as a suitable dark field pattern. An array of squares is illustrated in FIG. 7. Such an array diffracts light in both the x and y directions, as well as at 45 degree angles to the x and y directions. Such patterns diffract light in a greater number of directions than a properly oriented grating. Consequently, a smaller fraction of the diffracted light from such patterns is captured compared to the light captured from a properly oriented grating. However, when such patterns are illuminated by quadrupole illumination, the incident light from all four directions is diffracted by such patterns. As noted above, when a grating pattern is illuminated with quadrupole illumination, light from only two of the four directions is diffracted. Thus, the downstream power of the light diffracted by such patterns is about the same as the downstream power of light diffracted by a grating.

Some patterns are imaged more precisely with a dark field array than with a dark field grating. For example, a narrow line is imaged more effectively using a dark field grating. For the L shaped pattern 450 illustrated in FIG. 7, an array of dark field features is advantageous. The pattern 450 is actually the intersection of two gratings 451 and 452. Grating 451 is in the vertical direction and grating 452 is in the horizontal direction. The period of these gratings is the center to center distance between two squares 453. The image 455 that results from the pattern 450 is illustrated in FIG. 7.

Figure 8:
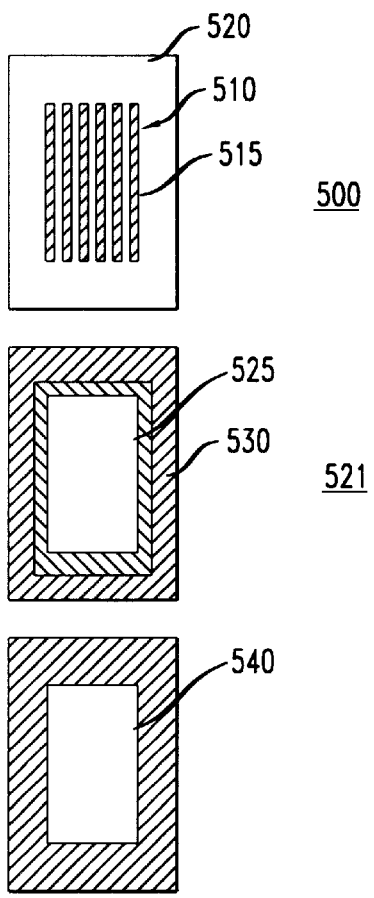
FIG. 8 illustrates two masks used to create a dark-field image of a contact pad, and the image created using the two masks.

As previously noted, the dark field imaging system of the present invention can employ either one mask or two. If two masks are used to image the previously described contact pad, the dark-field imaging mask is not required to define the contact pad actually printed by the wafer. A sketch of two exemplary masks used to produce a dark field image of a contact pad is illustrated in FIG. 8. The first mask 500 ensures that only dark field radiation is incident the second mask 520. The first mask 500 has a grating 510 consisting of lines 515 printed on a transparent substrate 520. The grating 510 fills an area that is larger than the contact pad pattern 525 on mask 521. The contact pad pattern 525 has a thin clear line 530 surrounding it. The thin clear line is used to sharpen the edges of the pattern. The contact pattern 540 that is created using masks 500 and 522 corresponds to the contact pad pattern 525 on mask 521.

Figure 9:
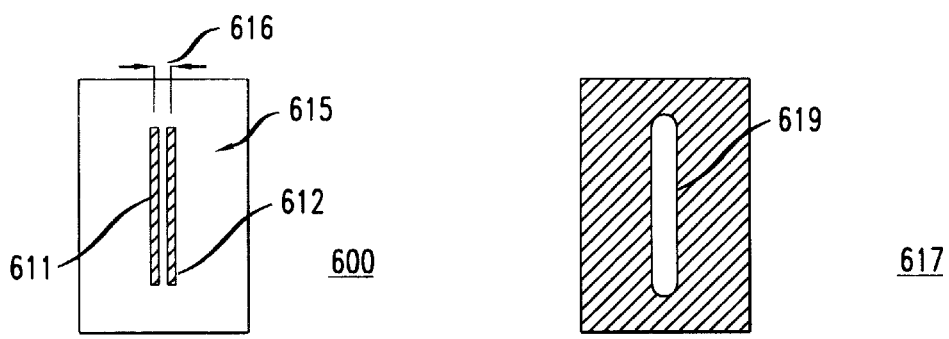
FIG. 9 illustrates a mask used to create a dark field image of an isolated line in which the dark field mask feature is a grating that is oriented parallel to the length of the line and the isolated line created using the mask.

A single mask that is used to create a dark field image of an isolated line is illustrated in FIG. 9. The mask 600 is a grating consisting of two lines, 611 and 612, formed on a transparent substrate 615. To print an isolated line, it is advantageous if the patterned radiation is a cone centered about the optical axis of the imaging system. Since the off axis radiation is incident on the mask at an angle that does not provide the desired angular distribution, the mask is required to both diffract only the higher order light to the downstream imaging optics and to provide the desired angular distribution. These two functions are performed by the grating configuration illustrated in FIG. 9. Specifically, the dark field mask 600 has a dark field grating 615 that consists of lines 611 and 612. The number of lines depends upon the width of the lithographic line 619 in the image plane 617. The wider the lithographic line 619, the more lines in the dark field grating.

It is advantageous if the radiation is incident on the energy sensitive material in the image plane at an angle normal to the image plane (i.e. the angle of incidence is 0 degrees from normal). To effect the desired angle of incidence, the pdf (period of the dark field grating) is equal to $\lambda/\sin(\theta_c)$ where $\theta_c$ is the angle at which the radiation from the condenser is incident on the dark field grating. Since the lithographic line width is not necessarily an integer multiple of the dark field period, one must select a pdf that provides the desired result.

There are a number of aspects of the dark field grating that can be controlled in order to obtain the desired image. In the example where the period of the grating is not an integer multiple of the lithographic linewidth, the pdf can be selected to obtain a desired depth of focus of the lithographic feature. One skilled in the art will appreciate that the image depth of focus affects the lithographic linewidth. Also, the duty cycle of the grating can be selected to produce a lower intensity image. Lowering the intensity of the image reduces the width of a lithographic line in a positive resist. Another method of controlling the lithographic linewidth is to reduce the width of outermost lines in the grating. Yet another method is to place the outside lines in the grating a distance from the adjacent line(s) that is a one-half integer (e.g. 3/2) multiple of the pdf. Radiation diffracted from a line so placed will be out of phase with the radiation diffracted from the other lines in the grating. Such a grating functions as a leaky phase grating, and makes the edge of the lithographic line steeper.

Figure 10:
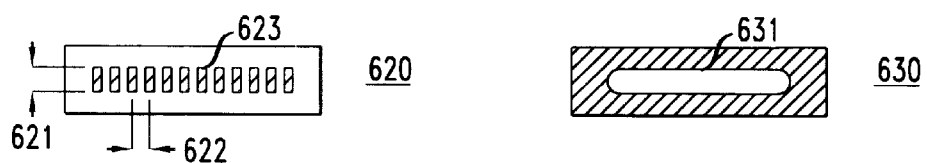
FIG. 10 illustrates a mask used to create a dark field image of an isolated line in which the dark field mask feature is a grating that is oriented perpendicular to the length of the line and the isolated line created using the mask.

FIG. 10 illustrates another dark field grating mask 620. The dark-field grating mask provides an image of an isolated line 631 in the image plane 630. In the mask 620, the length 621 of the grating lines 623 is equal to the linewidth of the lithographic line 631. Thus, in mask 620, the grating has an orientation that is orthogonal to the length of the isolated lithographic line 631. The period 622 of the dark field grating is equal to $\lambda/\sin\theta_c$, where $\lambda$ is the wavelength of the radiation incident on the mask 620 and $\theta_c$ is the angle of the beam from the radiation source (not shown) relative to the optical axis of the exposure apparatus (not shown). Since the lithographic line 631 is many times longer than the period 622 of the grating, the problems associated with placing the grating lines within the confines of the linewidth (FIG. 9) are avoided.

Figure 11:
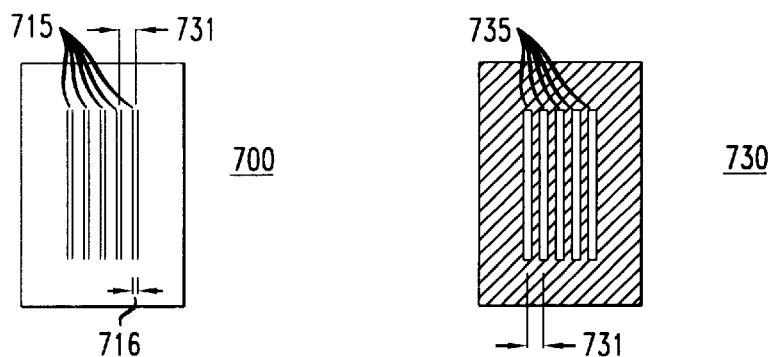
FIG. 11 illustrates a mask used to create a dark-field image of a grating, in which the dark field mask feature is a grating that is oriented parallel to the length of the grating, and the grating created using the mask.

In the two-mask embodiment of the present invention, the grating can occupy an area that is larger than the feature (e.g. the length of the grating lines can be longer than the lithographic linewidth). When such a dark field grating is imaged onto its corresponding lithographic feature on a second mask, the beam of illuminating radiation is wider than the lithographic line itself. This is advantageous because precise alignment of the two masks is not required, as long as the corresponding feature of the second mask falls within the area illuminated by the radiation diffracted from the dark field feature on the first mask. In the two-mask embodiment of the present invention, radiation diffracted from a mask similar to that illustrated in FIG. 11 is used to illuminate the second mask. The radiation from the second mask is then focused on the energy sensitive resist material If the desired pattern is a grating, then a series of gratings is used to create the image of each line in the grating. In the single mask embodiment of the present invention, a mask 700 (FIG. 11) is used to create an image 730 consisting of five parallel lines 735. The mask 700 has five pairs of lines (i.e. gratings) 715. Each pair of lines 715 creates an image of one line 735 in the image plane 730. The period 716 of each grating 715 is too small to be imaged. Thus there are two basic periods in the mask pattern. The first period 735 is that of the lithographic pattern 735 in the image plane 730. The second period is the period 716 of the dark field grating pattern 715. It is advantageous if period 731 is an integral multiple of 716.

The angle of incidence of the radiation on the pattern 700 is selected so that the downstream lens collects light diffracted by the dark field gratings 715. The diffracted light contains several orders, of which the (−1,0) order enters the lens. Satellite orders of radiation, which result from the light diffracted by the grating with lithographic period 731, are about the (−1,0) order. Of these satellite orders, the lens captures the (−1, −1) order. The period 716 is selected so that the (−1,0) and (−1, −1) orders diffracted by gratings 715 make approximately equal but opposite angles to the optical access of the system as the diffracted radiation passes through the downstream lens. Such a relationship between the two diffracted orders creates an image with maximum depth of focus.

Figure 12:
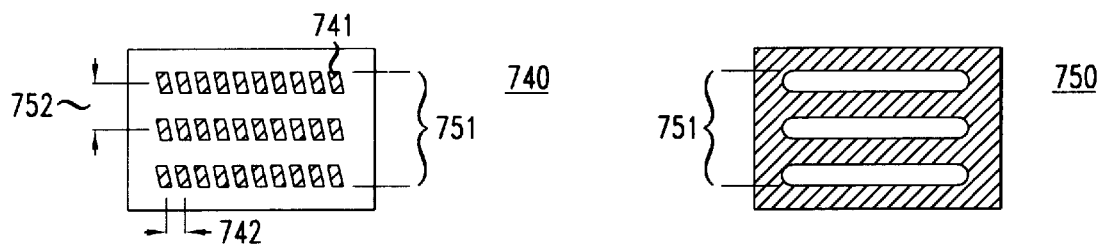
FIG. 12 illustrates a mask used to create a dark-field image of a grating, in which the dark field mask feature is a grating that is oriented in a direction orthogonal to the length of the grating, and the grating created using the mask.

Another example of a single dark field mask used to produce an image of a grating is illustrated in FIG. 12. FIG. 12 depicts a dark field mask 740 that is used to form an image of three-line grating 751 in image plane 750. Consequently, there are two gratings in mask 740. The first grating is the grating of small lines 741 that has a dark-field period 742. The second is the three-line grating pattern 751 that has a lithographic feature period 752.

The lines 741 in the dark-field grating mask 740 are slightly tilted. The grating lines are tilted to further control the radiation diffracted from the mask. As previously noted, the purpose of the dark field mask is to direct the incident radiation so that the zero order radiation transmitted through the mask is not captured by the downstream imaging optics. A further purpose is to transmit a dark field image of the mask pattern so that it is captured by the imaging optics. This dark field image consists of both +1 and −1 diffraction orders. There is also secondary diffraction from the three-line grating pattern 751.

In order to obtain an image with a large depth of focus, the slope is used to control the interference of the radiation diffracted from both the grating with the dark field period 742 and the grating with the lithographic feature period 752. Specifically, it is advantageous if the (−1, 0) order radiation diffracted from the dark field grating interferes with the (−1, −1) order radiation diffracted from the lithographic grating. This objective is achieved by controlling the slope of the dark field grating lines 741. The slope (in radians from a vertical line) is equal to $\lambda/(\sin(\theta_c) \times 2 \times \text{pgrat})$ where $\lambda$ is the wavelength of the incident radiation, $\theta$ is the angle of the incident radiation, and pgrat is the period 752 of the lithographic grating.

In the two mask embodiment of the present invention, the period of the grating in the first mask is selected to provide two beams of radiation that have approximately equal and opposite angles of incidence both on the second mask, which is a normal grating that defines the grating pattern. If the dark field grating lines were not tilted, the (−1,0) order would be on the x-axis and the (−1, +1) and (−1, −1) orders would be on the y-axis above and below the (−1,0) order. The x-axis and the y-axis are in the plane perpendicular to the optical axis. Whether or not a particular order of diffracted radiation is captured by the downstream optics is determine by the distance of the diffracted order from the intersection of the x and y-axis.

Tilting the grating lines improves the quality of the image. Tilting the grating lines move the (−1,0) order above the x axis, the (−1, −1) order an equal angle below the x-axis and the (−1, +1) order so high above the x-axis that it is not captured by the camera. The two orders, (−1,0) and (−1, −1) interfere in the energy sensitive resist to provide an image with a large depth of focus.

The angle of the tilt in the grating lines, in radians from a vertical line, is calculated using the above-described formula for calculating the slope of the grating. Another advantage of the grating depicted in FIG. 12 is that the period 752 of the lithographic grating 751 need not be a multiple of the period 742 of the dark field grating.

As previously noted, in the two-mask embodiment, the dark field beam that illuminates the lithographic feature is further diffracted by that feature. The various beams transmitted through the lithographic feature are referred to by two numbers as previously described. In the two-mask embodiment when the lithographic feature is a grating, it is desirable to direct into the downstream optics the (−1,0) beam transmitted through the feature along with one, but not both, of the (−1, +1) and (−1,−1) beams. The combinations are advantageous because an image of the grating that has a large depth of focus is obtained.

Figure 13:
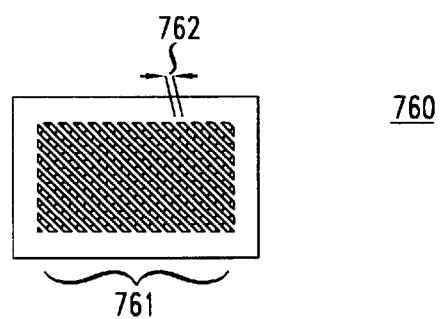
FIG. 13 illustrates two masks used to create a dark-field image of a grating in which the dark field mask feature is a grating that is oriented in a direction nearly orthogonal to the length of the grating, and the grating created using the masks.
Figure 13:
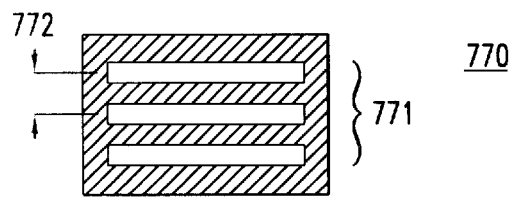
Figure 13:
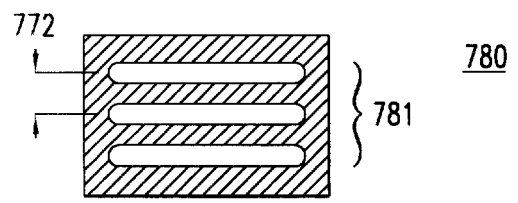

One example of the two-mask embodiment that utilizes a sloped, dark field grating to control the angle at which the second mask is illuminated is illustrated in FIG. 13. In FIG. 13, a dark field mask 760 has a series of sloped lines 761. The sloped grating lines move the beam diffracted from the mask 760 in the image plane relative to the position of the beam diffracted from a mask with vertical lines.

The advantageous illumination angle φ on the second mask is $\phi = \text{asin}(\lambda/\text{pgrat})/2$ where pgrat is the period of the lithographic grating on the second mask. If the condenser illumination is incident on mask 1 at an angle $\theta_c$, then the period of the dark field grating (pdf) on mask 1 is equal to $\lambda/(\sin(\theta_c) - \sin(\phi))$. As previously noted, sloped grating lines provide certain advantages because the slope can be used to direct the radiation to a certain point in the pupil filter. This provides the ability to filter out some of the radiation with pupil filters and thereby improve the depth of focus of the resulting image. Generally, the image of a short-period lithographic grating where unwanted diffraction orders do not enter the lens is not improved by tilting the grating lines. The image depth of focus for large-period gratings is improved when the grating lines are tilted to direct some of the transmitted radiation to a pupil filter. This is because satellite orders that are close to the main order (−1,0) are diffracted by lithographic periods with longer periods. If an unwanted satellite order (e.g. (−1, +1)) passes through the lens, the depth of focus of the lithographic grating is decreased. The use of pupil filters and adjusting the tilt and period of the dark field grating lines provides the ability to block out the unwanted orders and obtain an image with a large depth of focus.

The present invention has been described in terms of quadrupole illumination of the mask along the x and y axes.

Quadrupole illumination forty-five degrees to the x and y axes is also contemplated. The dark field grating lines that were in the x and y directions for quadrupole illumination along the x and y axes would be at 45 degrees to those axes for the latter case.

In all of the previous examples, the dark field features are gratings. In these examples, only two of the four quadrupole beams incident on the dark field gratings are diffracted efficiently by the gratings. The other two quadrupole beams simply add a little intensity to the final image. Since two of the four quadrupole beams are not used efficiently, it is possible to illuminate the dark field gratings with dipole illumination. For example dipole radiation incident at 45 degrees from the x and y axes can be used to illuminate a dark field grating in which the lines are slightly tilted from the x- or y-axis. The tilt of the lines is used to direct the radiation diffracted by the grating along either the x- or y-axis.

For example, referring to FIG. 13, the first mask 760 is illuminated with bipole radiation from the upper right and lower left (+45 degrees and +235 degrees). The slope of the grating lines 761 is a little less than 45 degrees from the y axis. The light incident on the first mask 769 is diffracted along the y axis to illuminate the second mask 770. Tilting the lines 761 at an angle slightly greater than 45 degrees from the y axis permits illumination of a mask grating oriented in the other direction.

Figure 14:
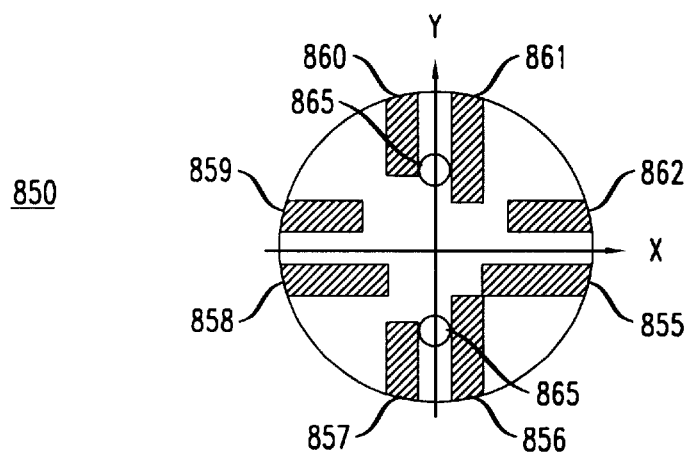
FIG. 14 illustrates a pupil filter with blocking regions in which none of the beams along the y-axis are blocked.

The pupil filter is placed in the projection lens downstream from the second mask. The pupil filter 850 is illustrated in FIG. 14. The pupil filter has eight opaque stops 855–862. The distance between the stops 855–862 is at least as large as the diameter of the angular spread of the dark-field imaging radiation transmitted through the pupil filter. Circles 865 illustrate this angular spread.

Figure 15:
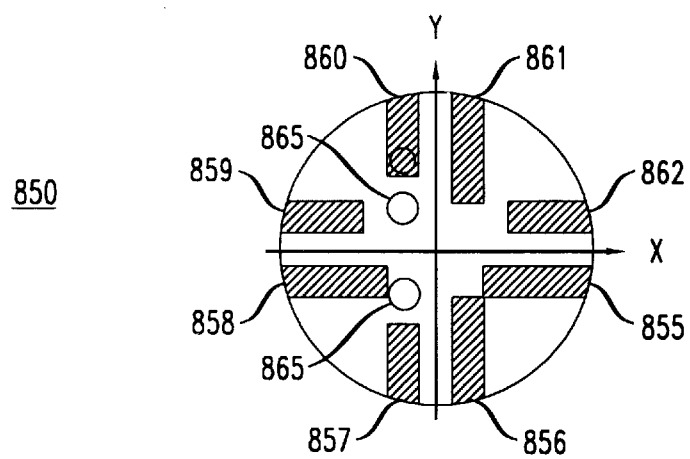
FIG. 15 illustrates a pupil filter with blocking regions in which the incoming beams of radiation have previously been deflected to the left of the y-axis and one of the beams is blocked by a blocking region in the filter.
Figure 16:
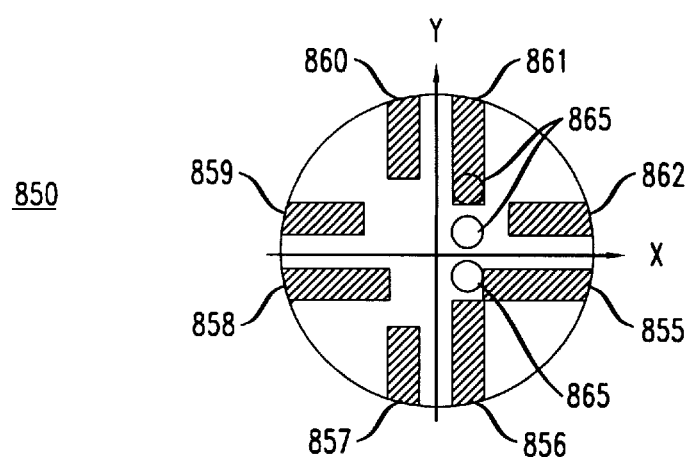
FIG. 16 illustrates a pupil filter with blocking regions in which the incoming beams of radiation have previously been deflected to the right of the y-axis and one of the beams is blocked by a blocking region in the filter.

Opaque stops 855, 857, 859 and 861 have a first length and stops 856, 858, 860, and 862 have a second, shorter length. The stops 855–862 are not placed on the x or y-axis of the pupil filter 850, but are placed to either side of the x and y axis. In FIG. 14, none of the dark field imaging radiation is blocked because the angle of illumination is positioned along the y-axis. In FIG. 15, the angle of illumination is changed as indicated by the position of the imaging radiation 865 to the left relative to the y-axis. This shift in position is accomplished by tilting the gratings in the first, dark-field, mask. In FIG. 16 the angle of illumination has been shifted to the right of the y-axis by tilting the gratings.

Figure 17:
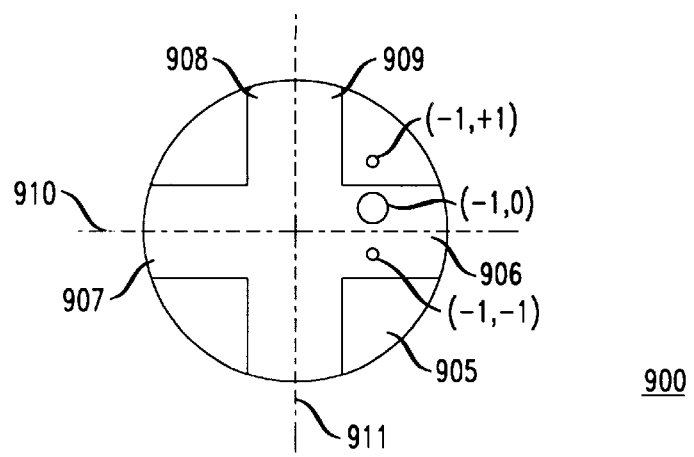
FIG. 17 illustrates a pupil filter with blocking regions that block a portion of the incoming radiation that is used in conjunction with a mask that directs the radiation off-axis onto the pupil filter.

Another embodiment of a pupil filter is illustrated in FIG. 17. The pupil 900, has four filter tabs 905. Each filter tab is placed in a different quadrant 906, 907, 908 and 909 of the pupil filter 900. The (−1, +1), (−1, 0), and (−1, −1) beams are not on either the x-axis 910 and the y-axis 911. As previously noted, the beams of radiation are diffracted by using a dark-field grating with sloped lines. The pupil filter 900 is advantageous because the placement of the stops 905 is such that the stops do not have a substantial effect on the performance of the lens. The energy from most masks is typically directed along the x-axis 910, the y-axis 911, or the center of the pupil 900. The stops 905 are placed at a distance from the x-axis and y-axis so as only to block radiation that is specifically directed at the stops.

The advantage of the filter 900 in FIG. 17 compared with the filter 850 in FIGS. 14–16, is that the larger tabs 905 allow the illumination beam (−1,0) to have a larger diameter without being blocked. Therefore, the illumination beam can be less coherent. Partial coherence can be used to suppress unwanted artifacts. Artifacts are features that appear on the final image that were not present on the mask. Artifacts are usually due to interference effects and are suppressed or smeared out by using more incoherent illumination.

Filters can be used in either the one-mask or two-mask embodiments of the present invention. In the one-mask embodiment (e.g. FIG. 12) the period of the dark field grating 742 is controlled to direct the (−1, −1) and (−1,0) orders of radiation so that they are between the stops or tabs of the filter.

Aerial images for the contact pad illustrated in FIG. 6 were simulated using MATHCAD. MATHCAD is commercially available from MathSoft of Cambridge Mass. Using the Fourier transform of the electric field of the illuminated mask depicted in FIG. 5, the program applied a filter, which corresponded to the lens aperture, to the transform. The program then used the inverse Fourier transform to compute the aerial image projected on the energy sensitive film (i.e. photoresist) on the wafer.

Figure 18:
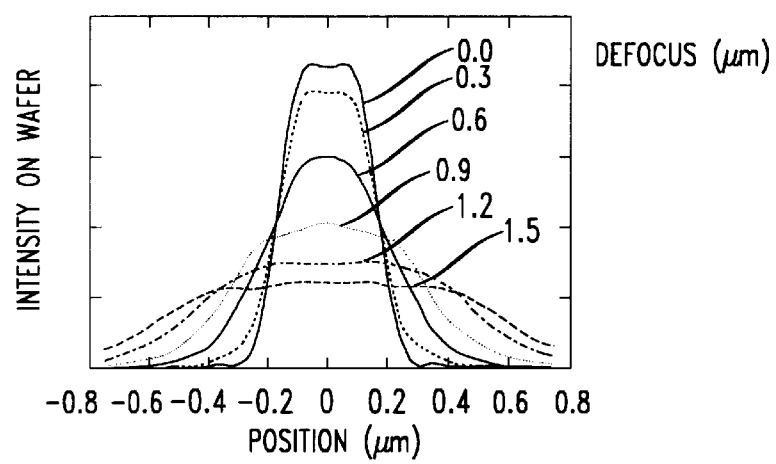
FIG. 18 illustrates the intensity profiles for images created at several different degrees of defocus using top-hat illumination.

FIG. 18 illustrates simulated aerial images (intensity as a function of position) of the FIG. 5 contact pad grating. The image was simulated for a 0.6 NA camera with top hat illumination ($\sigma$=0.6 and an angular spread of ±6 degrees). The wavelength of the exposing radiation was 193 nm. FIG. 18 illustrates several images, each having a different value of defocus in the range of 0 to 1.5 $\mu$m.

Figure 19:
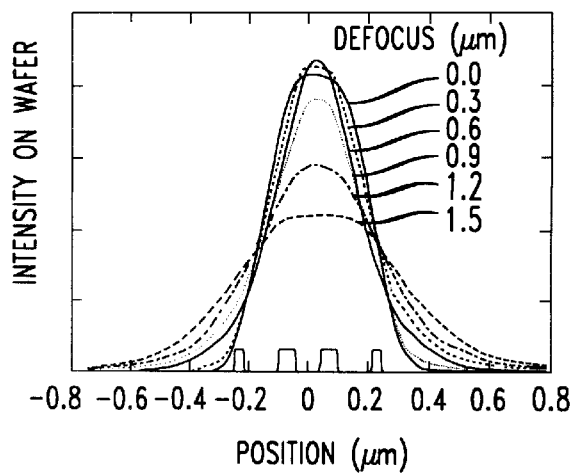
FIG. 19 illustrates the intensity profiles for images created using a range of defocus values and the dark-field illumination of the present invention.

FIG. 19 illustrates simulated aerial images of the contact pad produced using the dark field imaging process of the present invention. The simulated aerial images are for the two mask dark field system in which the dark field mask is the mask illustrated in FIG. 5. Comparing FIG. 18 and FIG. 19, it is clear that the aerial images illustrated in FIG. 19 have a better depth of focus than the aerial images illustrated in FIG. 18. This is because the camera with the top-hat illumination uses a large angular spread ($\sigma$=0.6) to resolve the fine features on the mask. In contrast, the dark field imaging system of the present invention provides illumination with a smaller angular spread ($\sigma$=0.25, which is more spatially coherent) which provides a superior depth of focus over top-hat illumination. Features of other sizes automatically produce a value of partial coherence ($\sigma$) that is near optimum for that particular feature.

A grating image provided by the two-mask system was simulated using Math Cad to calculate the aerial image. PROLITH/2 software simulation software obtained from Finle Technologies of Austin, Tex. was used to determine the resist pattern that is produced using such a two-mask system.

Figure 20:
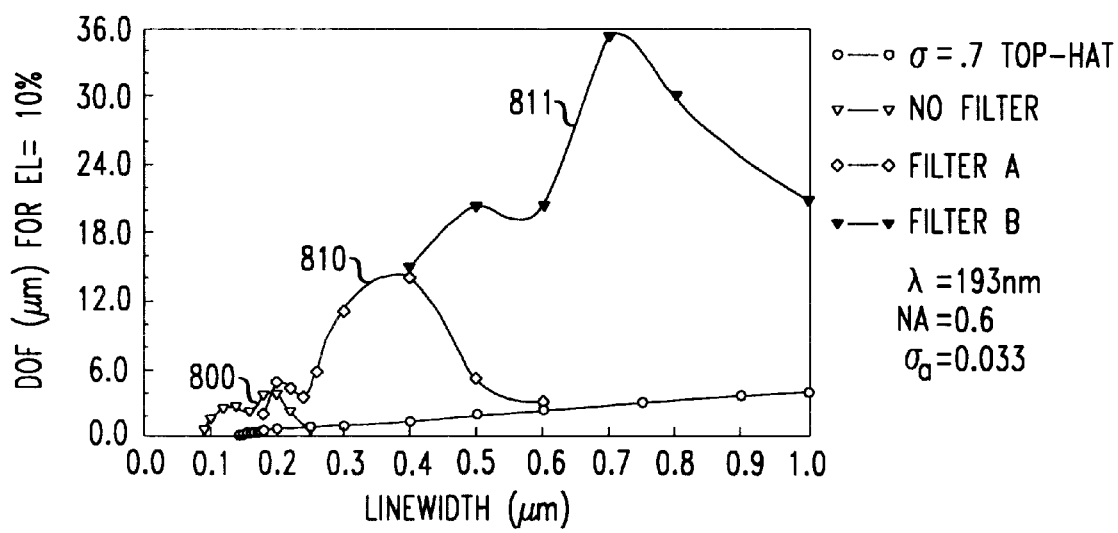
FIG. 20 illustrates the depth of focus for images of gratings having various periods created using top-hat illumination, dark-field illumination without pupil filters, and dark-field illumination with pupil filters.

The simulation was performed for a 0.6 NA camera with a 4× reduction ratio operating at a 193-nm wavelength. The energy sensitive material was selected to have a 0.2 $\mu$m thickness and a contrast ($\gamma$) of five. The image was simulated for conventional top-hat illumination ($\sigma$=0.7) for a one-mask, one-lens system and for quadrupole dark-field illumination that had a $\theta_c$ of 11.5 degrees, an L1-Aperture with an acceptance angle of 8.2 degrees and a source coherence, $\sigma_a$, of 0.033. The results of the simulation are illustrated in FIG. 20. FIG. 20 illustrates that, in the absence of a pupil filter (i.e. a dark spot in the pupil that blocks the transmission of radiation), an additional diffraction order begins to pass through the projection lens when the grating linewidth exceeds about 0.2 $\mu$m. This is illustrated by 800 in FIG. 20. These additional orders are undesirable because they interfere with the two beams that are responsible for the imaging improvements provided by the two-mask dark field system. The effects of pupil filters on the image depth of focus are illustrated by 810 and 811. Line 810 is the image depth of focus as a function of linewidth using the pupil filter illustrated in FIG. 15. Line 811 is the image depth of focus as a function of linewidth using the pupil filter illustrated in FIG. 16. As previously noted, the enhanced depth of focus is obtained by using pupil filters to block certain undesirable orders of radiation.

The image depth of focus increases for line widths from 0.2 μm to 0.4 μm when the imaging radiation is diffracted to the left and the pupil filter illustrated in FIG. 15 is used. The increase in depth of focus is attributed to the blocking of the (−1, +1) radiation incident on the pupil by stop 860. As illustrated by line 811 in FIG. 20, an even greater increase in depth of focus was obtained for larger linewidths (0.4 μm to 0.8 μm) when the angle of illumination is changed to place the imaging radiation 865 to the right of the y-axis and the pupil filter in FIG. 16 is used. In this example, the stop 861 blocks the (−1, +1) radiation incident on the pupil filter.

Figure 21:
FIG. 21 illustrates a dark-field mask for imaging an isolated space and isolated space using the mask.

If the desired pattern is an isolated space, the dark field image is created by a mask with two dark-field gratings. Each grating is adjacent to a transparent region on the mask that defines the space. The period of the gratings that flank the space are arranged to be 180 degrees out of phase. The image of the isolated space is where the phase makes the transition from 0 degrees to 180 degrees. In the two-mask embodiment of the present invention, an opaque feature (e.g. a chrome feature formed on a transparent substrate) is used to define the width of the dark line. Such a mask is illustrated in FIG. 21. In FIG. 21 the mask 912 has gratings 913 and 914. The space 915 between the gratings is such that the gratings 913 and 914 are 180 degrees out of phase. Mask 912 thereby produces an image of an isolated space. The image 916 of the space is the region where the phase of the transmitted radiation makes the transition from 0 degrees to 180 degrees. At the end 911 of the gratings 913 and 914 the two out of phase gratings close to form one uniform grating. The out of phase gratings provide the desired image. The phase transition provides a sharp termination of the image without unwanted artifacts.

In the present invention, the dark field features are also used to alter the phase of the light transmitted therethrough. Consequently, the dark field features are used as a phase shift mask to enhance the resolution of the resulting image. The dark field gratings provide a great deal of flexibility in this regard because the dark field gratings can produce any phase shift by moving the phase of the grating as it is written. Also, the phase of one grating can be blended into the phase of another by varying the phase of the grating over a region several periods long.

Figure 22:
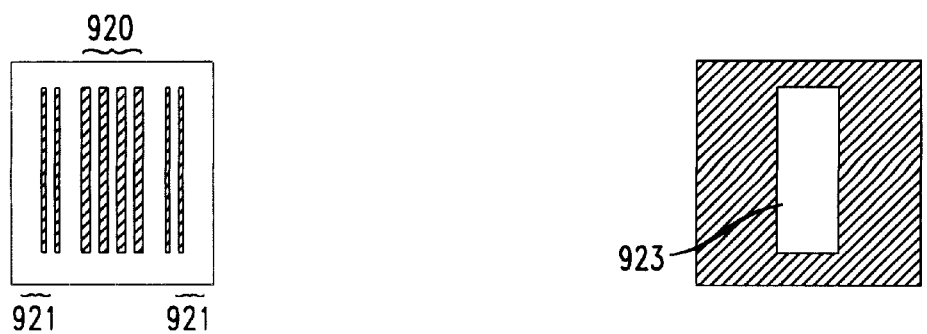
FIG. 22 illustrates a dark-field mask for imaging a contact pad and the image created using the mask.

One example of a dark-field grating phase shifting mask is illustrated in FIG. 22. In FIG. 22, the dark-field mask has a grating 920, with a second grating 921 of thinner lines on either side of grating 920. The thin lines of the second grating 921 do not diffract enough light to print on the energy sensitive layer. However, the electric field from the thin-line grating 921 is out of phase with the field transmitted by the grating 920. The interference between the two gratings, 920 and 921, sharpens the edge of the feature (contact pad 923).

Once a mask pattern for producing a dark-field image of a particular feature is determined, that pattern is combined with patterns for other features on a single mask. That mask is then used in a lithographic process for device fabrication to introduce the desired dark-field pattern into the energy sensitive material. The image is then developed into a pattern and transferred into the underlying substrate using expedients well known to one skilled in the art and not described in detail herein. One skilled in the art will appreciate that the specific examples described herein are provided to simply illustrate masks that provide dark field images for particular structures. Mask structures other than those specifically described are contemplated as suitable.

What is claimed is:

1. A lithographic process for device fabrication comprising:

providing at least one patterned mask, wherein the at least one patterned mask has a non-imaged feature that cooperates with a lithographic feature to define a pattern feature;

transmitting a beam of radiation onto the at least one patterned mask with the non-imaged feature, wherein the beam is transmitted onto the mask at an angle of incidence and wherein the non-imaged feature has a configuration such that bright-field radiation is transmitted through the non-imaged feature at a first angle and dark-field radiation is transmitted through the non-imaged feature at a second angle;

providing imaging optics downstream of the at least one patterned mask with the non-imaged feature thereon, wherein the imaging optics are positioned so that the dark-field radiation transmitted at the second angle is captured by the imaging optics and the bright-field radiation transmitted at the first angle is not captured by the imaging optics wherein the non-imaged feature is too small to be resolved by the imaging optics;

directing the dark-field radiation onto a layer of energy sensitive material formed on a substrate to introduce an image of the pattern feature in the energy sensitive material; and developing the image to form the pattern feature in the energy sensitive material.

2. The process of claim 1 wherein the beam of radiation is incident on the patterned mask at an off-axis angle, wherein the axis is an optical axis that is normal to the surface of the patterned mask.

3. The process of claim 1 wherein the non-imaged feature and the lithographic feature are coextensive on one patterned mask.

4. The process of claim 3 wherein the non-imaged feature is a periodic grating structure.

5. The process of claim 1 wherein the radiation is transmitted onto a first patterned mask with a non-imaged feature thereon and the dark-field radiation that is transmitted through the non-imaged feature is then transmitted onto the lithographic feature on a second mask, and wherein the radiation transmitted through the lithographic feature on the second mask is directed through the imaging optics to introduce the image of the pattern feature into the energy sensitive material.

6. The process of claim 5 wherein the non-imaged feature is a periodic grating structure.

7. The process of claim 6 wherein the non-imaged feature is at least two gratings wherein one grating is out of phase with at least one other grating.

8. The process of claim 6 wherein the lithographic feature is a line and the grating is orthogonal to the line.

9. The process of claim 5 wherein the radiation transmitted by the non-imaged feature on the first mask illuminates the cooperating lithographic feature on the second mask with quadrupole illumination.

10. The process of claim 5 wherein the radiation transmitted by the non-imaged feature on the first mask illuminates the cooperating lithographic feature on the second mask with top hat illumination.

11. The process of claim 1 wherein the dark-field radiation transmitted through the non-imaged feature is the radiation that is diffracted by the non-imaged feature.

12. The process of claim 1 wherein the non-imaged feature is a grating having lines that are tilted about 45 degrees from normal.

13. The process of claim 12 wherein the non-imaged feature is illuminated with dipole illumination.

14. The process of claim 1 wherein the non-imaged feature is a two-dimensional array of squares wherein the two-dimensional array has a first period in a first direction and a second period in a second direction orthogonal to the first direction.

15. The process of claim 1 further comprising directing the dark field radiation onto a pupil filter before the dark field radiation is directed onto the energy sensitive resist material, wherein the pupil filter has at least one stop and a portion of the radiation directed into the pupil filter is blocked by the at least one stop.

* * * * *